(12) United States Patent
Holzer

(10) Patent No.: US 9,239,358 B2
(45) Date of Patent: Jan. 19, 2016

(54) OPTIMIZED AUTOMATED TEST EQUIPMENT MULTI-PATH RECEIVER CONCEPT

(75) Inventor: Kyle David Holzer, Bountiful, UT (US)

(73) Assignee: ADVANTEST CORPORATION, Tokyo (JP)

( * ) Notice: Subject to any disclaimer, the term of this patent is extended or adjusted under 35 U.S.C. 154(b) by 0 days.

(21) Appl. No.: 13/391,260

(22) PCT Filed: Aug. 18, 2009

(86) PCT No.: PCT/EP2009/005980
§ 371 (c)(1),
(2), (4) Date: May 2, 2012

(87) PCT Pub. No.: WO2011/020479
PCT Pub. Date: Feb. 24, 2011

(65) Prior Publication Data
US 2012/0208484 A1    Aug. 16, 2012

(51) Int. Cl.
*H04B 17/00* (2015.01)
*G01R 31/3167* (2006.01)
*G01R 31/319* (2006.01)

(52) U.S. Cl.
CPC ...... *G01R 31/3167* (2013.01); *G01R 31/31926* (2013.01)

(58) Field of Classification Search
CPC ............... G01R 31/3183; G01R 31/318307; G01R 31/318342; G01R 31/31907; G01R 19/04; G01R 31/3177; G01R 31/318508; G01R 31/318547; G01R 31/318572
USPC .................................................... 455/67.11
See application file for complete search history.

(56) References Cited

U.S. PATENT DOCUMENTS

| | | | | |
|---|---|---|---|---|
| 5,321,849 | A * | 6/1994 | Lemson | 455/67.11 |
| 6,066,953 | A * | 5/2000 | Wadell | G01R 31/3167 324/601 |
| 6,397,090 | B1 * | 5/2002 | Cho | H04B 17/318 455/127.3 |
| 2005/0240852 | A1 | 10/2005 | Inaba et al. | |
| 2006/0082358 | A1 | 4/2006 | Conner | |
| 2009/0167323 | A1* | 7/2009 | Shoulders | 324/650 |
| 2010/0052708 | A1* | 3/2010 | Ribeiro | G01R 31/303 324/756.01 |

* cited by examiner

*Primary Examiner* — Ajibola Akinyemi

(57) ABSTRACT

A multi-path receiver for automated test equipment. The multi-path receiver includes an input for receiving low-power signals and high-power signals. The high-power signals have signal amplitude higher than the low-power signals. The multi-path receiver further comprises an output for outputting a received signal, a first path for transmitting a received high-power signal from the input to the output and a second path for transmitting a received low-power signal from the input to the output. The second path comprises an amplifier. A first switch is provided for switching a received high-power signal to the first path and for switching a received low-power signal to the second path. A high-power amplifier is also connected between the input and the first switch for amplifying the received signal independent of its input power before it is switched with the first path or the second path.

20 Claims, 3 Drawing Sheets

US 9,239,358 B2

OPTIMIZED AUTOMATED TEST EQUIPMENT MULTI-PATH RECEIVER CONCEPT

CROSS-REFERENCES TO RELATED APPLICATIONS

This application is a Continuation of and claims priority to International Application No. PCT/EP2009/005980, filed on Aug. 18, 2009, titled "OPTIMIZED AUTOMATED TEST EQUIPMENT MULTI-PATH RECEIVER CONCEPT," by Holzer, et al, which is herein incorporated by reference.

TECHNICAL FIELD

The present disclosure relates generally to the field of automatic test equipment (ATE) and more specifically to the field of RF (Radio Frequency) receiver structures for ATE.

BACKGROUND

Automatic or automated test equipment is used for manufacturing semiconductor devices. Purely digital devices may usually be tested with ATE which drive and receive digital signals. Semiconductor devices which process analog, as well as digital signals (so-called mixed signal integrated circuits) have to be tested with ATE which can produce and receive both analog and digital signals. Such an ATE may also be called a mixed signal tester.

SUMMARY OF THE INVENTION

An embodiment of this present invention provides a solution to the challenges inherent in multi-signal automated equipment testing. This object is solved by a multi-path receiver for an ATE according to exemplary embodiments.

An embodiment of the present invention is based on the finding that a high-power amplifier may be used as a first stage of a low-noise floor receive path. This first stage is then used for a wide range of input signals coming from the input terminal, e.g., for low-power input signals as well as for high-power input signals. Hence, this gain stage is reused for large instantaneous dynamic range, high 1-dB-compression point, and low-noise floor receiver paths. The said high-power amplifier is then followed by a switch with only two different switch positions differentiating between low-power input signals on the one hand and middle- and high-power signals on the other hand. In other words, the first-stage high-power amplifier is connected between the input terminal and the switch.

Some embodiments of the present invention provide a multi-path receiver for an automated test equipment, the multi-path receiver comprising an input for receiving low-power signals as well as high-power signals, wherein the high-power signals have a higher signal amplitude than the low-power signals. An output is provided for outputting a received signal. The multi-path receiver comprises a first path for transmitting a received high-power signal from the input to the output and a second path for transmitting a received low-power signal from the input to the output, the second path comprising an amplifier. A first switch is provided for switching a received high-power signal to the first path and for switching a received low-power signal to the second path. A high-power amplifier is connected between the input and the first switch for amplifying the received signal independent of its input power before it is switched to the first or second path.

Hence, according to a further embodiment, a method for testing a mixed-signal integrated circuit comprises receiving an analog test signal, from the mixed-signal integrated circuit, amplifying the received test signal, independent of its input power, with a high-power amplifier to obtain an amplified test signal. After its amplification the amplified test signal is switched to a high-power signal path in case of a high-power test signal or to a low-power signal path in case of a low-power test signal.

The inventive multi-path receiver concept allows for the minimization of the switch count before the first gain stage, e.g. the high-power amplifier, thereby minimizing losses and noise introduced into the following receive paths by switches. Furthermore, signal distortions are improved for mid- and high-power signals for which the high-power amplifier between the input and the first switch allows for a combined receive path. Therefore only two receive paths, one for low-power signals and another one for mid- and high-power input signals, are necessary. This may lead to a more compact receiver design compared to the state-of-the-art designs explained above. This may minimize board space necessary on a PCB of an RF test card.

BRIEF DESCRIPTION OF THE DRAWINGS

The present invention will be better understood from a reading of the following detailed description, taken in conjunction with the accompanying drawing figures in which like reference characters designate like elements and in which.

DETAILED DESCRIPTION

Figure 1:
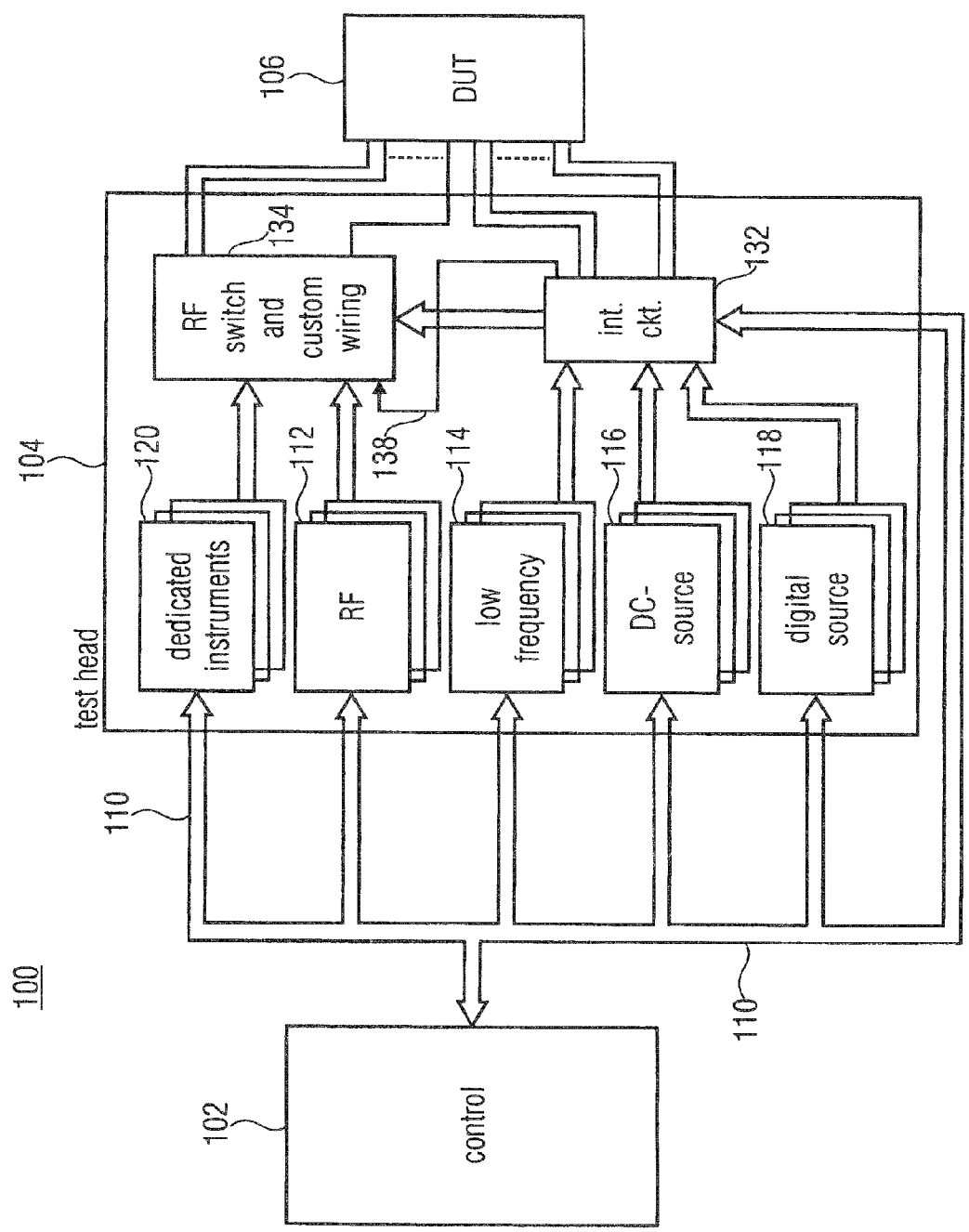
FIG. 1 illustrates simplified schematic of an automated test equipment in accordance with an embodiment of the present invention.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

Notation And Nomenclature:

Some portions of the detailed descriptions, which follow, are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

This present invention provides a solution to the increasing challenges inherent in automated test equipment with multiple input signals. As discussed in detail below, various embodiments of the present disclosure provide a multi-path receiver structure circumventing the above-described disadvantages, leading to a more compact receiver design, and, at the same time, having a flexible and better receive capabilities.

FIG. 1 shows a schematic architecture of an exemplary mixed signal tester 100. Control electronics 102, which may be a high-speed computer including a memory, controls the tester 100. It may be programmed such that the tester 100 can perform numerous tests on a variety of semiconductor devices. The control electronics 102 are connected over one or more buses 110 to slot cards in a test head 104, wherein the slot cards correspond to various tester subsystems. Test head 104 routes various test signals needed to test a DUT 106 (Device Under Test). The slot cards in the test head 104 contain electronic circuitry which must be positioned close to the DUT 106 to provide for good signal integrity.

Tester 100 includes subsystems that process RF signals as indicated by reference numeral 112. RF signals are loosely defined as those signals having frequencies in the range of about 10 MHz up to about 6 GHz. Tester 100 also includes a subsystem that processes lower frequency AC (Alternating Current) signals, sometimes referred to as base band signals, as indicated by reference numeral 114. The low frequency subsystem 114 is made up of low frequency analog sources and receivers. These devices are implemented using digital signal processing technology. A typical system may operate at various GHz, allowing for waveforms in almost any shape to be produced or analyzed. Further, tester 100 comprises a DC subsystem 116 that processes DC (Direct Current) signals and a digital subsystem 118 that processes digital signals. The DC subsystem 116 is made up of DC sources and meters. These devices can produce or measure DC bias conditions. The digital subsystem 118 generates and receives digital signals. It may be made up of digital drivers and receivers.

RF subsystem 112 is made up of a plurality of RF sources and receivers. Each RF source may be programmed to generate a test signal at a frequency and level specified by control electronics 102. Some or all of the RF sources receive a base band signal from the low frequency subsystem 114. The baseband signal is then used to modulate the RF signal provided by the source. Each RF receiver measures the power of a signal received from DUT 106 over a range of frequencies. Operating parameters of the RF sources and RF receivers, such as power levels and frequency ranges, may be controlled by control electronics 102. Some or all of the RF receivers can also down-convert an RF signal to a baseband signal which is then passed to the low frequency subsystem 114. Sometimes the combination of RF sources and receivers is not sufficient to make an RF measurement of the DUT 106 which requires the determining of various parameters of the device. In these cases dedicated instruments 120 may also be added to the RF subsystem.

Dedicated instruments 120, RF circuitry 112, low frequency circuitry 114, DC circuitry 116, and digital circuitry 118, are all coupled to the test head 104. Connections to the RF circuitry 112 and the dedicated instruments 120 may be made through RF switching circuitry 134. Each pin of DUT 106 which receives or produces an RF signal is connected to RF switching circuitry 134. To fully test a DUT 106, it is usually necessary to run several tests. The RF subsystem 112 must be configured differently for each test. The configuration may be changed by moving cables and opening and closing switches inside the RF switching circuitry 134. These switches operate under the control of the control electronics 102. The signals generated by the low frequency circuitry, the DC circuitry and the digital circuitry 118 are routed to pins of the DUT 106 via interconnect circuitry 132. Where necessary, interconnect circuitry 132 contains switches to make the appropriate connections. Interconnect circuitry 132 is connected to RF switching circuitry 134 through signal path 138. Signal path 138 allows DC bias conditions to be introduced or measured within the RF subsystem.

To test the DUT 106, control electronics 102 executes a test-program. The test-program configures tester 100 to make a first measurement for specifying the settings for the instruments 112, 114, 116, 118, and 120, and also the setting for switches in RF switching circuitry 134 and interconnect circuitry 132. The measurement is made and passed back to control electronics 102. Then, tester 100 is reconfigured to take a next measurement. This process is repeated until all the required measurements are taken.

While an overview of an exemplary mixed signal tester has been provided with reference to FIG. 1, the focus will by now laid on RF receivers of RF subsystem 112. As has previously been explained, such RF receivers for analog input signals having a large dynamic range reaching from very low input powers to relatively high input powers may be located on test cards that may be coupled to the test head 104 by putting them into the dedicated card slots.

Figure 2A:
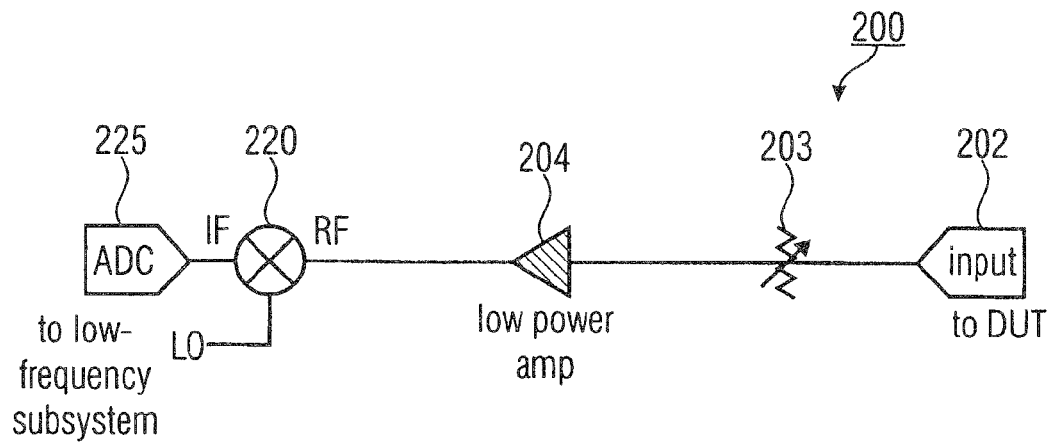
FIGS. 2A and 2B illustrates a simplified schematic of receiver structures used for mixed signal automated test equipment.

A state-of-the-art RF multipath receiver 200 for an ATE is schematically shown by FIG. 2A. The multi-path receiver 200 comprises an input terminal 202 for receiving analog RF input signals from DUT 106. The received input signals are then fed to a low-power amplifier 204 which is used as a first gain stage in a low-noise floor path. The gain of a typical low-power/low-noise amplifier 204 lies in the range of 10-30 dB. Its noise figure is in the range of 1-2 dB. The 1-dB-compression point of low-power amplifier 204 with respect to amplifier output-power is in the range 10-15 dBm.

The configuration of FIG. 2A limits the 1-dB-compression point to low powers due to the low-power amplifier 204. The 1-dB-compression point thereby is the measure of receiver performance that indicates the input level at which the receiver begins to deviate radically from its linear amplitude response. In a linear device, for each dB of input level increase, there is a corresponding dB increase in output level. In the case of input overload, the output does not continue to increase with each output increase, but, instead, the output tends to limit. The input level at which the output deviates from linear response by 1 dB is known as the 1-dB-compression point. Hence, in order to prevent the non-linear distortions of the low-power amplifier 204 for mid- and/or high range input powers, an adjustable attenuator 203 must be used to add a large amount of attenuation between input 202 and low-power amplifier 204. Hence, the low-power amplifier 204 in the design of FIG. 2a is used for input signals of all possible input power or input level ranges, i.e. from low- to high-power input signals. The after their amplification the input signals are further processed via a mixer 220 and an analog-to-digital converter 225.

Typical low, mid and high-power receiver ranges are depicted in Table 1:

|  | Noise Floor | 1-dB-compression point |
|---|---|---|
| High-power receiver | −A dBm/Hz | +25 dBm +/− 10 dB |
| Mid-power receiver | −B dBm/Hz | −10 dBm +/− 10 dB |
| Low-power receiver | −C dBm/Hz | −45 dBm +/− 10 dB |

In Table 1 |A|<|B|<|C|, and −C dBm/Hz represents the lowest Noise Floor. Additional attenuation at the input of a receiver degrades the ability of the receiver to measure low power signals. A commonly accepted method of describing the sensitivity of a receiver or the ability to measure low power signals is known as the receiver noise figure (F). The relationship between F and the attenuation at the input of the receiver is described by the Friis Equation, for a cascaded system according to $$F_N = F_1 + \frac{F_2 - 1}{G1} + \frac{F_3 - 1}{G1 G2} + \ldots + \frac{F_N - 1}{G1 G2 \ldots G_{N-1}},$$

where F and G are noise figure and available power gain respectively.

For an attenuator the absolute magnitude of Fi and Gl are equal to the amount of attenuation. The amount of attenuation found between input 202 and the amplifier 204 adds directly to the overall receiver noise figure. This shows the receiver noise figure is easily dominated by the amount of attenuation at the input of the receiver.

In summary for FIG. 2A, the ability for the receiver structure depicted therein to measure high and mid-power signals is limited by the following two issues: the compression of the low-power amplifier 204 and attenuation at the receiver input compromises the receiver noise figure. In reality it is impossible for the variable attenuator 203 to switch to O dB of attenuation. Even the lowest possible amount of attenuation will still be a few dB of attenuation. This amount of attenuation will similarly degrade the receiver Noise Figure for low-power signals.

Figure 2B:
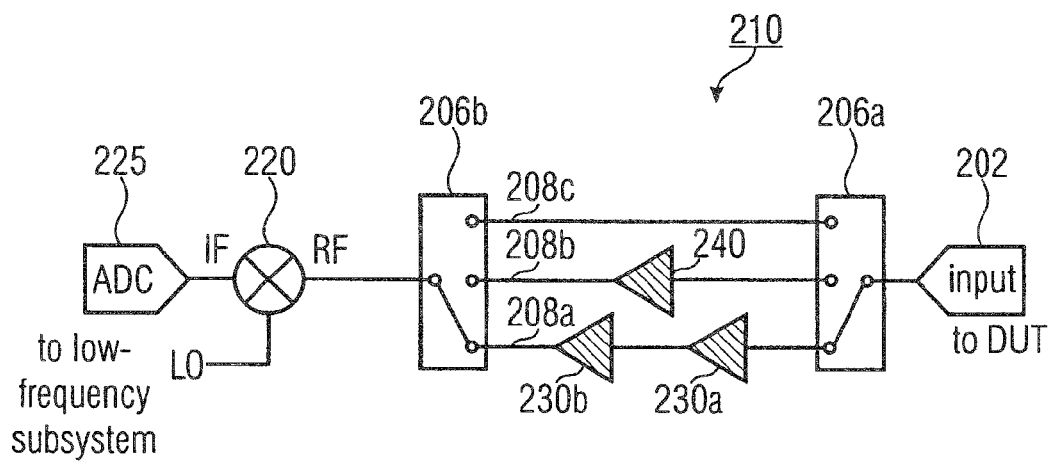

A further conventional receiver design 210 which attempts to handle each of the three above-mentioned requirements, e.g., large instantaneous dynamic range, high 1-dB-compression point, and low noise floor, is depicted in FIG. 2B. As can be seen from FIG. 2B, the input terminal 202 is directly coupled to a first switch 206a. According to the design 210, the switch 206a has three different switch positions for coupling the input 202 to three different receive paths, wherein a first path 208a is used for low-power input signals, a second receive path 208b is used for middle-power receive signals, and a third receive path 208c is used for high-power receive signals. A second switch 206b also having three switch positions is configured to connect one of the three paths 208a, 208b and 208c to a common receive path, comprising a mixer 220 and an analog-to-digital converter 225. As can be seen, each path 208a, 208b and/or 208c has dedicated amplifiers for handling the respective signal having either a low, middle, or high input power level. The dedicated amplifiers 230a, 230b and 240, however, cannot be used for the respective other signals, due to different compression characteristics, e.g., the low-power amplifiers 230a, 230b, cannot handle middle- or high-power signals due to a rather low compression point of the amplifier-chain 230a, 230b.

A further problem of the receiver structure 210 depicted in FIG. 2B are the switches 206a, b. Switches can generally be realized by relays or semiconductor switches, e.g. transistors. Typically, a switch comprises two switch positions, e.g., "on" and "off. However, the switches shown in FIG. 2B need to realize three switch positions which necessitate a complex and complicated switch design. Furthermore, each switch, e.g. in the form of a transistor or a relay, causes additional noise and losses in the signal paths 208a, 208b and 208c. This is especially disadvantageous for the low-noise path 208a, where low-power input signals have to be amplified by introducing as little noise as possible. However, due to the location of the first switch 206a between the input terminal 202 and the low-power amplifier 230a, this requirement is difficult to meet with the design 250 according to FIG. 2B. Noise introduced by the switch 206a is inevitably amplified by the amplifiers 230a, 230b.

Much of the absolute receiver power range does overlap and is common between the different receive paths ranges. The mid-power receiver power range can be completely covered by the low and high-power receiver paths. For this reason frequently the mid-power receiver does not exist in a system and the range must be split between the low and high-power receiver paths. The ability to measure with a large instantaneous dynamic range is very important to ATE test. This is to say to maximize the delta between the 1 dB compression point and the noise floor of the receiver path. This allows the receiver to measure at least two signals that have a maximum possible power difference at the same time. Without the mid-power path to measure a signal at −10 dBm the user would be forced to use the high-power receive path with a noise floor of −A dBm/Hz. With the mid-power receive path the use improves the receiver noise floor to −B dBm/Hz.

The design trade-off is acknowledged between the difficulty of adding additional mid-power receiver paths and the benefit of having a great number of optimized receive instantaneous dynamic ranges. Of course there can be multiple mid-power receive paths in a system to optimize for different instantaneous dynamic ranges. In FIG. 2A this could be done by adding additional possible variable attenuation values to variable attenuator 203. In FIG. 2B this could be done by adding completely new receive paths between switch 206a and 206b that have amplifiers similar to 240 with different gain and noise figure characteristics. However, this would not lead to simpler receiver structures and also not to less switching-noise amplification.

Due to the complex switch structure, the large amount of different signal paths and amplifiers, the design according to FIG. 2B is not very compact, requiring a large space on a PCB (Printed Circuit Board) or, in particular, a test card for an ATE. As described above, it may be difficult to realize the switches 206a, 206b, as integrated semiconductor elements or circuits, and, hence, discrete elements may instead be necessary. Also, noise introduced by the switch 206a is inevitably amplified by the amplifiers 230a, 230b.

Figure 3:
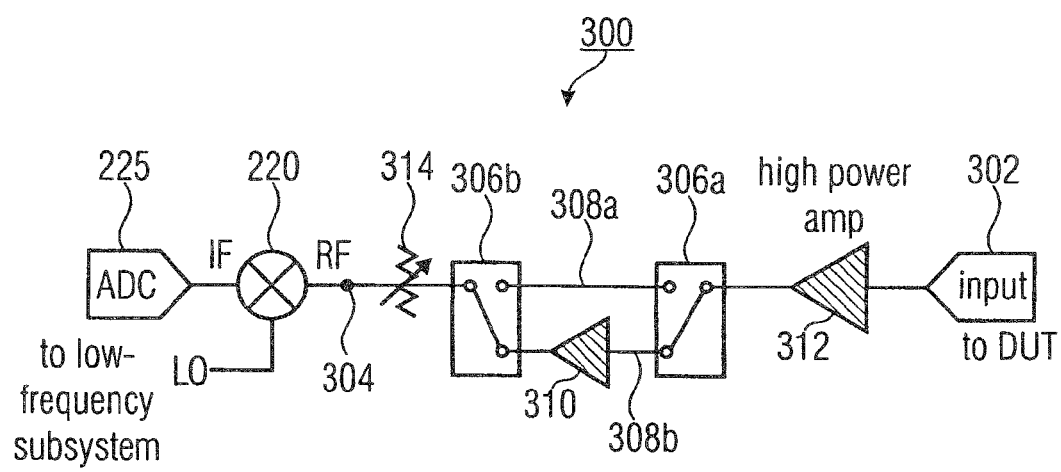
FIG. 3 illustrates an exemplary block diagram of a multi-path receiver structure for automated test equipment in accordance with an embodiment of the present invention.

FIG. 3 shows a schematic block diagram of a multi-path receiver structure 300 for a mixed-signal ATE according to an embodiment of the present invention. The receiver 300 comprises an input 302 which may be directly or indirectly coupled to a DUT 106. The input 302 may receive analog RF-signals of any arbitrary signal level used for mixed-signal IC (Integrated Circuit) testing, e.g., input 302 may receive low-power signals as well as high-power signals. Typically, high-power RF signals comprise a larger dynamic range than low-power RF signals. I.e., the amplitude of a high-power RF signal is larger than the amplitude of a low-power RF signal. Further, the receiver structure 300 also comprises an output 304 for outputting a received signal. Between the input 302 and the output 304, there is a first path 308a for transmitting a received mid- or high-power signal from the input 302 to the output 304, as well as a second path 308b for transmitting a received low-power signal from the input 302 to the output 304. The second path 308b for the low-power signals comprises an amplifier 310 which serves as a second gain stage for low-power input signals, as will become apparent further below. In order to switch a received input signal to either the first or the second receive path 308a, 308b, there is provided a first switch 306a for switching a received mid- or high-power signal to the first path 308a, and for switching a low-power signal to the second path 308b. For this purpose, switch 306a may be directly or indirectly coupled to an input power measuring device.

The multi-path receiver structure 300 further comprises a high-power amplifier 312 connected between the input 302 and the first switch 306a for amplifying a received signal independent of its input power before it is switched to the first or second receive path 308a, 308b. Hence, the high-power amplifier 312 serves as a first gain stage for all possible input signals. For that purpose, the high-power amplifier 312 is configured such that it is able to handle all possible input signal levels, including low-power signals as well as high-power signals. This means that its 1-dB-compression-point is located at a power level above the highest input signal power level to be expected at input 302. Hence, if it is assumed that low-power input signals may reach signal power levels e.g. up to −50 dBm and high-power input signals may reach signal power levels e.g. up to +10 dBm, or even up to +25 dBm, then the high-power amplifier 312 is configured to have its 1-dB-compression point at an input signal power level larger than +10 dBm, or preferably at an input signal power level larger than +25 dBm with respect to amplifier input power (see Table 1). In this manner the amplification of all possible input signals is possible without significant non-linear distortions.

According to an embodiment of the present invention, the multi-path receiver structure 300 further comprises a second switch 306b between the output 304 and the first and second paths 308a, 308b for connecting the first or second path 308a, 308b to the output 304, dependent on a switch position of the first switch 306a. In other words, the first and second switch 306a,b may be synchronized such that the input 302 is coupled to the output 304 either via the first or the second path 308a, 308b. Compared to the conventional design explained with regard to FIG. 2B, embodiments of the present invention allow a less complex switch design, since the switches 306a, 306b only have to switch between two different receive paths instead of three. This has a positive impact on design compactness as well as on the minimization of noise introduced by the switches 306a,b in the receive path.

As can be seen, the inventive receiver structure 300 has a minimized path count, compared to the conventional receiver structure depicted in FIG. 2B. The first receive path 308a is dedicated to mid- and high-power input signals, wherein the second receive path 308b is dedicated to low-power receive signals. Since all receive signals are amplified by the first high-power amplifier stage 312, the amplitude of an amplified high-power input signal may be too high for certain circuits following the output 304, such as, e.g., analog-to-digital converters (ADC) 225 converting the analog IF (Intermediate Frequency) or baseband signals to the digital domain. For this reason, high-power input signals amplified by high-power amplifier 312 may again be attenuated prior to delivering them to following circuit stages. Accordingly, the first and/or second switch 306a, 306b may be coupled to a variable attenuator 314 so that the variable attenuator is controlled by the first and/or second switch 306a, 306b in such a mariner that the variable attenuator 314 is set to a lower attenuation in case the switch positions of switches 306a, 306b indicate a low-power input signal, and to a higher attenuation in the case the switch positions indicate a high-power input signal. According to other embodiments, the variable attenuator 314 may additionally or alternatively be coupled to an input power measuring device such that its attenuation is set to lower values in case of lower input signal levels, and to higher values in the case of higher input signal levels. Hence, in general the attenuation of variable attenuator 314 is proportional to the input signal level. The gain of the amplifier 310 in the low-power receive path 308b shall be set to a value, such that the signal power level of an input signal travelling through the low-power signal path 308b is in a power range required by following circuit elements, e.g. the ADC 225. However, fine tuning of the required signal level for post-processing the received signals can also be achieved by means of the variable attenuator 314, which might e.g. be a variable resistor.

After passing the common RF output 304, the received RF signal may be down-converted in frequency by means of a mixer 220 into an IF or baseband range such that it may serve as an input for an ADC 225 prior to being passed to the low frequency subsystem 114 or the digital subsystem 118. With the inventive multi-path receiver concept, losses introduced into an input signal due to switching do not influence the noise behavior as negatively as in the conventional design according to FIG. 2b. This is due to the fact that losses added by the first switch 306a have a reduced effect when coming from higher input signal levels, which are achieved by the high-power amplifier 312. This behavior is shown through the Friis Equation (see above) for calculating the noise figure of a cascaded system. Therefore, the inventive receiver design may minimize the noise figures of the low-power signal paths, as well as the mid-, high-power signal paths. The combined mid- and high-power receive path may minimize board space necessary on the PCB of a test card for a test head of an ATE. As a result, according to a further embodiment of the present invention, an ATE or a test card for an ATE may be provided, comprising a plurality of test pins for testing a DUT 106, each of the test pins being coupled to a multi-path receiver structure 300 according to the present invention. Of course there could also be multiple mid-power receive paths in an inventive receiver design system to optimize for different instantaneous dynamic ranges. In FIG. 3 this could be accomplished by additional paths between 306*a* and 306*b* each path containing amplifiers with different gain and noise figure characteristics.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A multi-path receiver for an automated test equipment, the multi-path receiver comprising:
   an input for receiving low-power signals and high-power signals output from one or more devices-under-test being tested on the automated test equipment, the high-power signals having a signal amplitude higher than the low-power signals;
   an output for outputting a received signal from the multi-path receiver in the automated test equipment;
   a first path for transmitting a received high-power signal from the input to the output;
   a second path for transmitting a received low-power signal from the input to the output, the second path comprising a first amplifier;
   a first switch; and
   a high-power amplifier coupled between the input and the first switch and configured to amplify the received signal to an amplified signal before the amplified signal is switched to the first or second path through the first switch, wherein the first switch is configured to switch the amplified signal to the first path if the received signal is a high-power signal, and wherein further the first switch is configured to switch the amplified signal to the second path if the received signal is a low-power signal.

2. The multi-path receiver according to claim 1, wherein a low-power signal is characterized by a signal power level of up to −50 dBm and wherein a high-power signal is characterized by a signal power level of up to +10dBm.

3. The multi-path receiver according to claim 2, wherein the high-power amplifier is characterized in that its 1-dB-compression point is located at a signal power level above a highest possible signal power level of a received signal at the input, wherein an amplification of received low- and/or high-power signals may be performed without significant nonlinear distortions.

4. The multi-path receiver according to claim 3, comprising a second switch coupled between the output and the first path and the second path for coupling the first path or the second path to the output dependent on a switch position of the first switch, wherein the input is coupled to the output via the first path or the second path.

5. The multi-path receiver according to claim 4, wherein the first switch and the second switch are coupled to a device for measuring a power of a signal received at the input, and wherein further a switch position of the first switch and a switch position of the second switch depend on a measured input signal power.

6. The multi-path receiver according to claim 1, wherein a variable attenuator is coupled between the output and the first path and the second path, and wherein further the variable attenuator is configured to attenuate amplified signals coming from the first path and the second path to a predefined output signal level.

7. The multi-path receiver according to claim 6, wherein an attenuation of the variable attenuator is dependent on a switch position of the first switch and a switch position of the second switch, wherein it is set to a lower attenuation when the switch positions indicate a low-power input signal, or, to a higher attenuation when the switch positions indicate a high-power input signal.

8. The multi-path receiver according to claim 1, wherein the output is coupled to a circuit for down-converting a received signal in frequency.

9. An automated test equipment comprising a plurality of test pins for testing devices-under-test, each of the test pins being coupled to an input of a multi-path-receiver, the multi-path receiver comprising:
   the input for receiving low-power signals as well as high-power signals through the plurality of test pins of the automated test equipment, wherein the low-power signals and high-power signals are output from one or more devices-under test, the high-power signals having a signal amplitude higher than the low-power signals;
   an output for outputting a signal from the multi-path receiver for evaluating the one or more devices-under-test;
   a first path for transmitting a received high-power signal from the input to the output;
   a second path for transmitting a received low-power signal from the input to the output, the second path comprising a first amplifier;
   a first switch; and
   a high-power amplifier coupled between the input and the first switch and configured to amplify the received signal to an amplified signal before the amplified signal is switched to the first or the second path through the first switch, wherein the first switch is configured to switch the amplified signal to the first path if the received signal is a high-power signal, and wherein further the first switch is configured to switch the amplified signal to the second path if the received signal is a low-power signal.

10. The automated test equipment of claim 9, wherein a low-power signal is characterized by a signal power level of up to −50 dBm and wherein a high-power signal is characterized by a signal power level of up to +10dBm.

11. The automated test equipment of claim 10, wherein the high-power amplifier is characterized in that its 1-dB-compression point is located at a signal power level above a highest possible signal power level of a received signal at the input, such that an amplification of received low- and/or high-power signals may be performed without significant nonlinear distortions.

12. The automated test equipment of claim 11, comprising a second switch between the output and the first path and the second path for connecting the first path or the second path to the output dependent on a switch position of the first switch, such that the input is coupled to the output via the first path or the second path.

13. The automated test equipment of claim 12, wherein the first switch and the second switch are coupled to a device for measuring a power of a signal received at the input, and wherein a switch position of the first switch and a switch position of the second switch depends on a measured input signal power.

14. The automated test equipment of claim 9, wherein the multi-path receiver further comprises a variable attenuator coupled between the output and the first path and the second path, and wherein the variable attenuator is configured to attenuate received signals coming from the first path and the second path to a predefined output signal level.

15. The automated test equipment of claim 14, wherein an attenuation of the variable attenuator is dependent on a switch position of the first switch and a switch position of the second switch, such that it is set to a lower attenuation when the switch positions indicate a low-power input signal, or, to a higher attenuation when the switch positions indicate a high-power input signal.

16. The automated test equipment of claim 9, wherein the output is coupled to a circuit for down-converting a received signal in frequency.

17. A method for testing a mixed-signal integrated circuit, the method comprising:
   at an multi-path receiver in an automated test equipment, receiving an analog test signal from the mixed-signal integrated circuit being tested on the automated test equipment;
   at the multi-path receiver, amplifying a received test signal independently of an input power thereof with a high-power amplifier to obtain an amplified test signal;
   switching the amplified test signal to one of a high-power signal path in the multi-path receiver in case of a high-power test signal and a low-power signal path in the multi-path receiver in case of a low-power test signal; and
   attenuating received analog test signals coming from the high-power signal path and the low-power signal path to predefined output signal levels.

18. The method of claim 17, wherein a low-power signal is characterized by a signal power level of up to −50 dBm and wherein a high-power signal is characterized by a signal power level of up to +10 dBm.

19. The method of claim 17 further comprising:
   measuring a power of the analog test signal, wherein switching the amplified test signal to one of the high-power signal path and the low-power signal path depends on a measured analog test signal power.

20. The method of claim 17 further comprising down-converting a received analog test signal in frequency.

* * * * *